Figure 1:
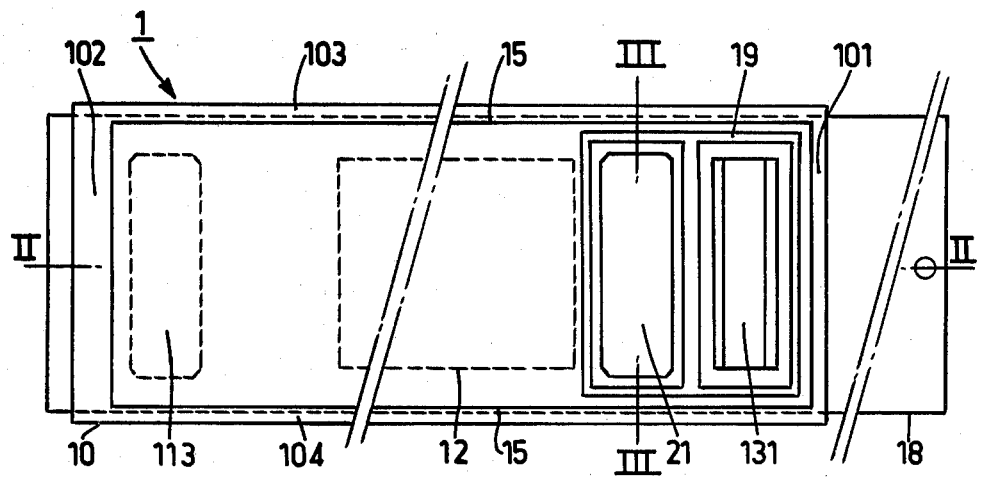

United States Patent [19]

Mahieu et al.

[11] 4,393,806
[45] Jul. 19, 1983

[54] BOAT FOR THE EPITAXIAL GROWTH FROM THE LIQUID PHASE

[75] Inventors: Marc Mahieu; Philippe Vandenberg, both of Caen; Jacques J. Varon, Troarn, all of France

[73] Assignee: U.S. Philips Corporation, New York, N.Y.

[21] Appl. No.: 237,816

[22] Filed: Feb. 25, 1981

[30] Foreign Application Priority Data

Feb. 27, 1980 [FR] France ............................... 80 04323

[51] Int. Cl.³ .......................................... H01L 21/208
[52] U.S. Cl. .................................... 118/412; 118/415; 118/421
[58] Field of Search ............... 118/412, 415, 421, 422; 156/621, 622; 148/171, 172

[56] References Cited

FOREIGN PATENT DOCUMENTS 54-152862 12/1979 Japan ................................. 148/171

Primary Examiner—John P. McIntosh
Attorney, Agent, or Firm—Paul R. Miller

[57] ABSTRACT

A boat for use in the epitaxial crystal growth of two layers on multiple substrates includes a structure where the substrates are located in a cavity in a support layer of the crucible structure, and a slide layer having two reservoirs is provided thereover. The two reservoirs contain the respective liquid solution for the two epitaxial layers to be provided, and the two reservoirs are respectively provided with the slide layer being the bottom layer of one reservoir and a removable sealing element being the bottom layer of the other reservoir. Upon moving the slide layer over the bottom supporting layer, the multiple substrates in the cavity are provided with liquid solutions to obtain epitaxial growth.

5 Claims, 6 Drawing Figures

BOAT FOR THE EPITAXIAL GROWTH FROM THE LIQUID PHASE

The invention relates to a boat for use in a device for the epitaxial growth from the liquid phase, which boat is designed for the successive formation of two semiconductor layers on at least one semiconductor substrate from two liquid solutions and which mainly comprises a crucible on the bottom of which a support is present having a cavity destined for the substrate, above which support a slide is provided having two reservoirs for the liquid solutions, which slide can be moved through a wall of the crucible relative to the support by a linear movement.

The invention relates to the epitaxial growth in general but more in particular to the growth of semiconductor compounds of the III–V type which are difficult to obtain by means of an industrial process.

U.S. Pat. No. 3,690,965 discloses an apparatus for epitaxial growth from the liquid phase. The apparatus described in this patent comprises three essential elements:
- a reservoir having the liquid solution
- a first flat plate on which the reservoir bears and which forms the bottom of the reservoir,
- a second flat plate which is provided below the preceding one and in a cavity of which the semiconductor substrate to be covered is present.

By a sliding motion the two plates can move according to a defined direction and take their different mutual positions and different positions with respect to the reservoir. The first flat plate has an aperture with a shape and cross section substantially equal to those of the bottom of the reservoir and also substantially equal to those of the cavity in which the substrate is present.

In a first step of the prior process the base of the reservoir, the aperture and the cavity are brought in alignment. The liquid solution then covers the substrate and fills the aperture. The two plates are then collectively moved relative to the reservoir. The substrate and the aperture filled with a small amount of liquid solution present in the cavity are then removed from the reservoir in such manner that from that instant the base of the reservoir is closed. The growth of the epitaxial layer on the substrate is then carried out from the small quantity of liquid solution by the conventional means of controlled temperature decrease.

The method according to the above-mentioned U.S. patent which consists of the formation of an epitaxial layer from a liquid solution deposited on the substrate as a comparatively thin layer has for its advantage, as is indicated in the patent that the resulting layer strikes in particular as regards the quality of the surface thereof. However, the apparatus described is not fit for industrial use, since it is complicated, bulky and not simple to operate.

It is the object of the present invention to place an apparatus of industrial design at the disposal of those skilled in the art, that is to say, an apparatus which can easily be used and which makes it possible to treat several substrates simultaneously.

According to the invention, a boat of the kind mentioned in the opening paragraph is characterized in that the reservoir for the first of the liquid solutions to contact the substrate has the support as its bottom, while the reservoir for the second liquid solution has a bottom comprising a removable sealing element.

The cavity which is provided in the support of the boat destined for the substrate or the substrates is situated in the central part of the support with, the reservoirs showing on the support two "locations" provided on two oppositely located ends of the boat in the direction of displacement.

Measured in a direction at right angles to the direction of movement of the slide, the sealing element is preferably longer than the length of the cavity of the substrates, with the measurement in the same direction.

In the sealing position of the reservoir, for the second liquid solution, the sealing element is present in a first space which is formed as a continuous bore of the slide and bears on the support. When the reservoir with the second liquid solution is open, the sealing element, in the rest position, is present in a second space provided in the support.

The slide bears on the support by means of a flat plate which is passed through a wall of the boat and which during the epitaxial growth process covers the whole cavity in the support.

Each of the above-described measurements form a contribution to make the boat according to the invention into an apparatus for carrying out epitaxial growth on an industrial scale. The accommodation of the reservoirs in one of the two ends of the boat presents the advanatage of leaving much space to the cavity provided in the support; and the cavity may be made to be long and wide so that several substrates can be placed in it which are treated simultaneously in identical circumstances. The boat maintains reasonable dimensions so that the use of ovens of not too large dimensions is possible. Otherwise the heating zone, where a very accurate control is necessary, remains narrow so that control is facilitated.

The cavity is not deep—approximately 2 mm—and during the method it is covered during the growth of the two epitaxial layers. The boundary of the substrates below a layer of liquid solution which is not so thick favours the quality of the growth.

The boat which has a simple structure also presents the advantage of easy operation because after introduction into the furnace only two actions are necessary.

A method of epitaxially growing two successive epitaxial layers on a semiconductor substrate by means of the boat having two reservoirs is characterized in that during a first step of the process, prior to the growth of the first epitaxial layer, the slide is moved relative to the support in such manner that the reservoirs filled with their respective liquid solutions and provided in a first of their locations, are transported to the second of these locations at the opposite end of the boat, and that in a second step of the same process taking place after depositing the first epitaxial layer the slide is moved in a direction opposite to that of the first direction of movement so that the reservoirs are returned to the first of the locations.

According to a further embodiment of the method, the reservoir with the first liquid solution is placed behind the reservoir comprising the second liquid solution relative to the direction of movement of the slide during the first step of the process.

Furthermore, the reservoir with the second liquid solution remains closed during the whole movement of the slide during the first step, and the sealing element is provided in the second space at the area of the second location after the movement.

In these circumstances the first liquid solution is at least partly distributed in the cavity in which the substrate bears or the substrates bear during the first step, while the second liquid solution is at least partly distributed in the cavity as a replacement of the remainder of the first liquid solution during the second step.

The epitaxial layers obtained by means of a boat according to the invention are of excellent quality and are characterized in particular by a surface state which can be compared with layers obtained by vapour phase epitaxy.

The boat according to the invention is suitable for the formation of epitaxial layers on any suitable substrate. Although it is designed for the epitaxial growth of III-V materials, in particular of GaAlAs, for example, for the stabilisation of electroluminescent diodes, it is suitable for cases of growth of semiconductor compounds on an industrial scale.

Figure 2:
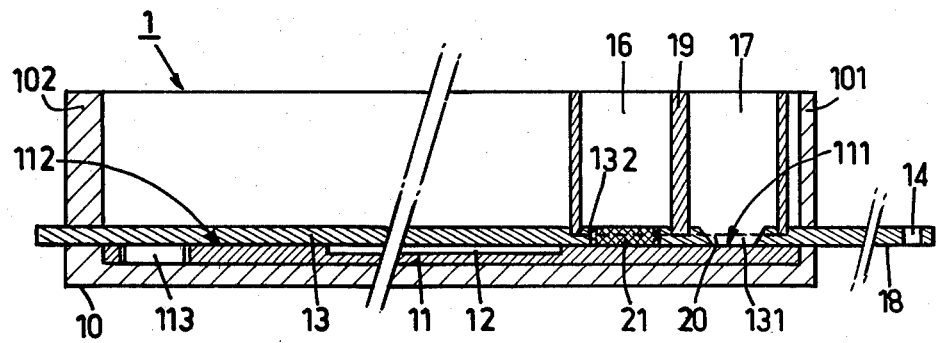
Figure 3:
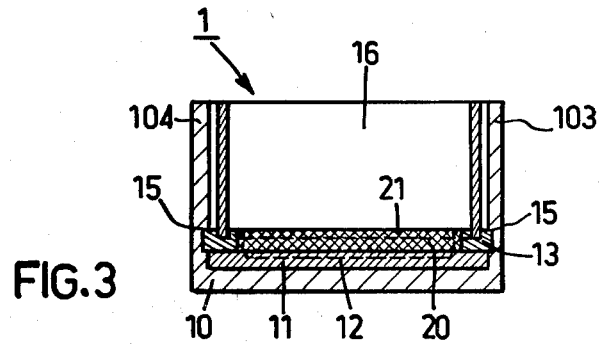

The invention will be described in greater detail with reference to the accompanying drawings, in which FIG. 1 is a plan view of a boat, FIG. 2 is a longitudinal sectional view taken on the line II—II in FIG. 1, FIG. 3 is a cross-sectional view taken on the line III—III in FIG. 1, FIGS. 4A, 4B and 4C which are slightly simplified with respect to the preceding figures, show three successive stages of the process which leads to the formation of two epitaxial layers on substrates in which a boat according to the invention is used.

The boat according to the invention is used in an epitaxial device of a known structure which in particular, has a horizontal space in which the boat is placed, and has a heating oven. Only the boat which is the subject matter of the present invention is shown in the figures.

The boat 1 shown in FIGS. 1, 2 and 3 has a vessel or crucible 10 in the form of a parallelepiped having a plate 11 placed on the bottom. The plate 11 which has a rectangular cavity 12 in the center for receiving semiconductor substrates forms the support of the boat. Another plate 13 which is passed through the walls 101 and 102 of the crucible 10 bears on the support 11. The plate 13 may perform a translation movement over the support 11 (from the right to the left and vice versa in FIGS. 1 and 2), for example, by means of a hook which extends in the hole 14. Preferably the plate 13 is held laterally with respect to the direction of movement in grooves 15 which are provided in the longitudinal walls 103 and 104 of the container 10.

The plate 13 supports two reservoirs 16 and 17 which are provided beside each other and serve to receive and hold liquid epitaxial solutions. The assembly of the plate 13 and of the reservoirs 16 and 17 forms the above indicated slide which is referenced 18.

For ease of manufacture, assembly and disassembly of the boat, the sidewalls of the reservoirs 16 and 17 are detachable relative to the base plate 13 of the slide 18. They form one assembly 19 which is accommodated in a groove 20 of the plate 13. The base 11 is made in the form of a removable plate which is slid in the bottom of the boat 1; in fact the bottom of the boat also forms part of the support.

In the boat according to the invention one of the reservoirs, reservoir 16, is provided at its bottom with a removable sealing element 21 while the other reservoir 17 has the support 11 as bottom. The reservoir 17 serves to receive and hold the first liquid solution which is to be contacted with the substrates in the cavity 12. The second solution is provided in the reservoir 16.

The reservoir 17 touches the support 11 through a first rectangular aperture 131 in the plate 13. The edges of the apertures at right angles to the direction of movement of the slide are preferably bevelled so as to facilitate the distribution of the first liquid solution and to regain the remainder of the solution in the reservoir 17 after the growth of the first epitaxial layer.

The reservoirs 16 and 17 which can be moved from one end of the boat to the other have two locations 111 and 112 on the support 11 (on the right and on the left, respectively, in FIGS. 1 and 2) which are each situated at one of the ends at the edge of the cavity 12.

A second aperture 132 which is provided on the plate 13 opposite to the reservoir 16 and which is slightly wider than the sealing element 21 provides a first space for the element. An aperture 113 which is provided in the support 11 provides a second space for the sealing element near the location 112. The aperture 113 is slightly wider than the sealing element 21. The sealing element, measured in the direction at right angles to the direction of movement of the slide 18 is longer than the cavity 12 measured in the same direction. As a result of this the sealing element, if the slide is moved, cannot fall in the cavity 12. During the movement of the slide 18 which leads the reservoir 17 from the location 111 to the location 112, the reservoir 16 remains closed at the bottom.

As is usual, the components which form the boat 1 are, for example, of graphite. The respective thicknesses of the sealing element 21, the plate 13 and the support 11 are such that the slide 18 can be moved without hindrance. In the embodiment shown in FIGS. 1–3 the thicknesses of the element are substantially the same but this is not necessary.

Figure 4A:
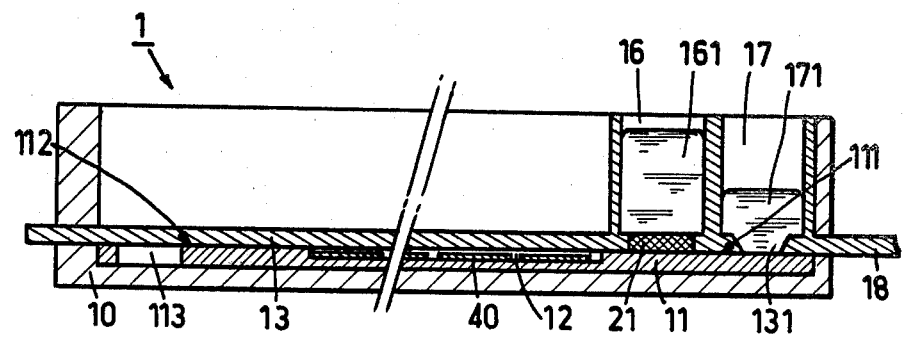

FIGS. 4A, B and C show three different instants in the epitaxial growth process while using the boat of the present invention. Prior to growing the first epitaxial layer the boat is in the position shown in FIG. 4A. Substrates 40 are located in the cavity 12. The slide 18 is shown so that the reservoirs are placed on the right and in FIGS. 4A in the location 111. The reservoir 16 is provided with the bottom element 21 present in the aperture 132. The reservoirs 17 and 16 comprise the first liquid solution 171 and the second liquid solution 161, respectively.

In a first step of the process the slide 18 passed through the wall of the boat is moved from the right to the left until the reservoirs are present at the other end of the boat in the location 112. During the movement of the slide the reservoir 16 remains closed by sealing element 21, while at least a part of the liquid solution 171 present in the reservoir 17 flows in the cavity 12 and covers the substrates 40 during its movement.

Figure 4B:
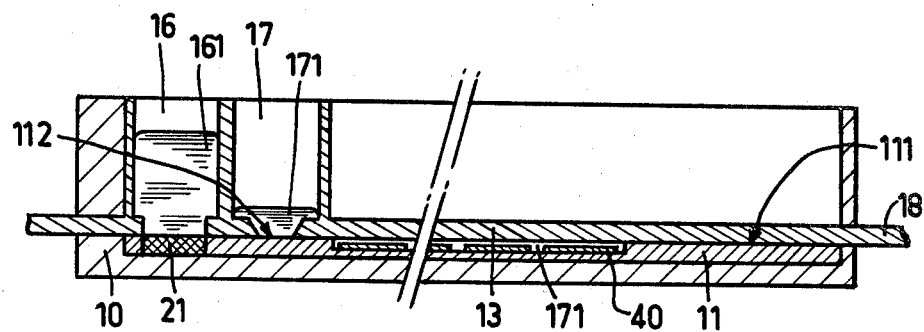
Figure 4C:
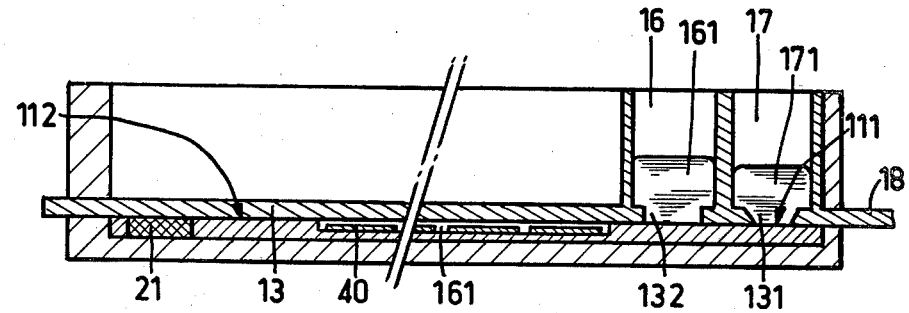

At the end of the first step the boat assumes the position as shown in FIG. 4B. The reservoir 17 is closed again. The sealing element 21 which is now opposite to the aperture 113 has fallen in the aperture. After a reset period during which a first epitaxial layer grows on the substrates 40, the slide 18 in the boat is drawn from the left to the right until the reservoirs 16 and 17 again bear in the location 111 (see FIG. 4C). During this movement the remaining liquid solution 171 rises in the cavity 12 in the reservoir 17. The reservoir, 16 whose bottom is open from the instant at which it is present above the cavity 12, causes the solution 161 to flow into cavity 12 and replace the solution 171. The second epitaxial layer may then be grown.

It is to be noted that during the two growth periods the cavity 12 is covered by the plate 13 of the slide 18.

The initial level of the liquid solution in the reservoir 16 is preferably so much higher than in the reservoir 17 that the second solution helps remove the first solution during the replacement of the first by the second.

In the boat according to the invention an important place is reserved for the cavity 12. As a result of this it is possible to treat a large number of substrates simultaneously. In a boat used by applicants and measuring on its outside approximately 40×10 cm, the cavity occupies 150 to 180 cm$^2$ and eight to ten substrates can be received and coated.

What is claimed is:

1. A boat for use in a device for liquid phase epitaxial growth of two successive semiconductor layers on a plurality of semiconductor substrates, said boat comprising
    a crucible structure,
    a bottom support layer of said crucible structure having a cavity for holding said substrates,
    a slide layer positioned above said support layer and extending for linear movement through opposite end walls of said crucible structure,
    two reservoirs for liquid solutions provided on said slide layer, one of said two reservoirs having said support layer as a bottom, and
    a removable sealing element provided in said slide layer to act as a bottom for the other of said two reservoirs.

2. A boat according to claim 1, wherein said cavity of said support layer is provided centrally in said crucible structure, and wherein said two reservoirs are adjacently located to one another near either of said opposite end walls.

3. A boat according to claim 1, wherein said crucible structure is generally rectangular with said slide layer moving in the direction of the long dimension, and wherein said sealing element and said cavity extend in the width direction of said rectangular crucible structure with said sealing element having a larger dimension in the width direction than said cavity.

4. A boat according to claim 1, wherein said slide layer bears on said support layer so that said cavity is covered during epitaxial crystal growth.

5. A boat according to one of claims 1, 2, 3 or 4 wherein said support layer includes an opening near one of said opposite end walls for holding said sealing element, said sealing element acting in a sealing position in said slide layer near the other of said opposite end walls.

* * * * *